US011463054B2

(12) United States Patent
Scheytt et al.

(10) Patent No.: US 11,463,054 B2
(45) Date of Patent: Oct. 4, 2022

(54) TRANSIMPEDANCE AMPLIFIER CIRCUIT

(71) Applicant: Sicoya GmbH, Berlin (DE)

(72) Inventors: Johann Christoph Scheytt, Dorsten (DE); Sergiy Gudyriev, Paderborn (DE)

(73) Assignee: SICOYA GMBH, Berlin (DE)

( * ) Notice: Subject to any disclaimer, the term of this patent is extended or adjusted under 35 U.S.C. 154(b) by 374 days.

(21) Appl. No.: 16/615,018

(22) PCT Filed: May 15, 2018

(86) PCT No.: PCT/DE2018/200048
§ 371 (c)(1),
(2) Date: Nov. 19, 2019

(87) PCT Pub. No.: WO2018/215030
PCT Pub. Date: Nov. 29, 2018

(65) Prior Publication Data
US 2020/0212856 A1 Jul. 2, 2020

(30) Foreign Application Priority Data
May 23, 2017 (DE) ................ 10 2017 111 197.2

(51) Int. Cl.
*H03F 3/45* (2006.01)
*G01J 1/44* (2006.01)
(Continued)

(52) U.S. Cl.
CPC .......... *H03F 3/45085* (2013.01); *G01J 1/44* (2013.01); *H03F 1/083* (2013.01); *H03F 1/26* (2013.01);
(Continued)

(58) Field of Classification Search
CPC ........ H03F 3/45085; H03F 1/083; H03F 1/26; H03F 2200/129; H03F 2200/228;
(Continued)

(56) References Cited

U.S. PATENT DOCUMENTS 5,130,667 A    7/1992 Chang et al.
5,345,073 A *  9/1994 Chang ................ H03F 3/08
                                                        250/214 A
(Continued)

FOREIGN PATENT DOCUMENTS

EP        0 556 000 A1    8/1993

OTHER PUBLICATIONS

European Office Action dated Oct. 15, 2020 issued in related European Application No. 18 732 649.1-1203.
(Continued)

*Primary Examiner* — Thanh Luu
*Assistant Examiner* — Monica T Taba
(74) *Attorney, Agent, or Firm* — Gordon Rees Scully; Mansukhani, LLP

(57) ABSTRACT

The invention relates to a circuit containing a transimpedance amplifier for converting two input currents into two output voltages, having a first amplifier part containing a first input, to which a first input voltage is applied, and into which a first input current flows, and having a second amplifier part containing a second input, to which a second input voltage is applied and into which a second input current flows, wherein the first amplifier part and the second amplifier part are connected to a common supply voltage, the first amplifier part and the second amplifier part are connected to a common current source, the input of the first amplifier part and the input of the second amplifier part have a differing direct voltage, and the first amplifier part and the second amplifier part are designed such that an output
(Continued)

Figure 1:
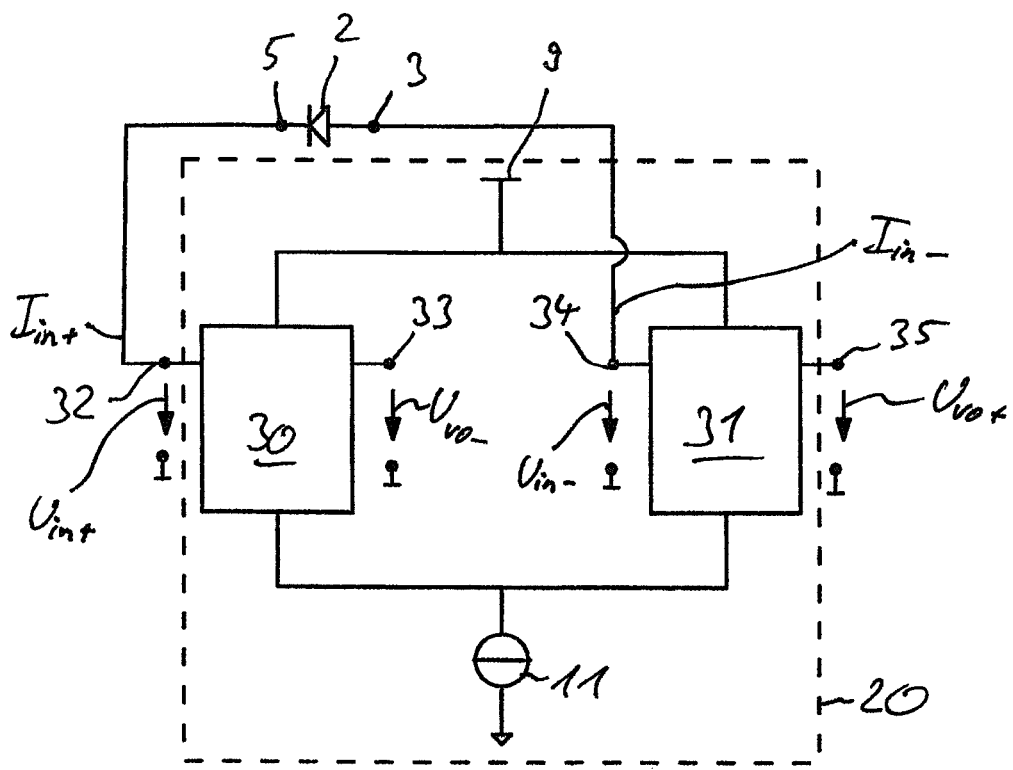

voltage of the first amplifier part is proportional to the input current of the first amplifier part and an output voltage of the second amplifier part is proportional to an input current of the second amplifier part.

16 Claims, 4 Drawing Sheets

(51) Int. Cl.
  *H03F 1/08* (2006.01)
  *H03F 1/26* (2006.01)
(52) U.S. Cl.
  CPC ... *G01J 2001/446* (2013.01); *H03F 2200/129* (2013.01); *H03F 2200/228* (2013.01); *H03F 2200/372* (2013.01); *H03F 2203/45116* (2013.01)
(58) Field of Classification Search
  CPC ..... H03F 2200/372; H03F 2203/45116; H03F 2200/462; H03F 2203/45154; H03F 1/302; H03F 1/3211; H03F 1/42; H03F 3/08; H03F 3/45076; G01J 1/44; G01J 2001/446
  See application file for complete search history.

(56) References Cited

U.S. PATENT DOCUMENTS

| | | | |
|---|---|---|---|
| 5,828,476 A * | 10/1998 | Bonebright | H04B 10/40 398/155 |
| 5,982,232 A | 11/1999 | Rogers | |
| 2006/0220746 A1 | 10/2006 | Kulasekeram | |
| 2015/0086221 A1 | 3/2015 | Shringarpure et al. | |
| 2018/0123536 A1* | 5/2018 | Souria | H03F 1/0261 |

OTHER PUBLICATIONS

German Examination Report dated Apr. 26, 2018 issued in German Patent Application No. 10 2017 111 197.2; filed May 23, 2017.

International Search Report dated Aug. 28, 2018 issued in International PCT Application No. PCT/DE2018/200048; filed May 15, 2018.

Bahram Zand, et al; "Transimpedance Amplifier With Differential Photodiode Current Sensing" Proceedings of the 1999 IEEE International Symposium on Circuits and Systems; May 30-Jun. 2, 1999; Orlando, Florida; IEEE Service Center; Piscataway, New Jersey; vol. 2; May 30, 1999; pp. II-624-II-627; XP-010341419.

Eli Bloch; "An InP Based Broadband Differential Transimpedance Amplifier for 40Gbs DPSK Photoreceivers"; Technion—Israel Institute of Technology; Oct. 2010; pp. 1-114; URL:http://webee.technion.ac.il/labs/projects/HighSpeedElectronics/Publications/Eli_Bloch_Thesis.pdf.

* cited by examiner

TRANSIMPEDANCE AMPLIFIER CIRCUIT

The present invention relates to a circuit including a transimpedance amplifier for converting two input currents into two output voltages, comprising a first amplifier section including a first input to which a first input voltage is applied and into which a first input current flows, and comprising a second amplifier section including a second input to which a second input voltage is applied and into which a second input current flows.

Transimpedance amplifiers are in particular used to convert an input current signal into an output voltage signal. The input current signal may, for example, be the current of a photodiode. The transimpedance amplifier receives the current signal which is output by the photodiode, converts the current signal into a corresponding voltage signal, and outputs the voltage signal. The voltage signal may optionally by amplified by means of an amplifier.

U.S. Pat. No. 5,345,073 A discloses a circuit comprising a transimpedance amplifier, to the input of which a photodiode is symmetrically connected. In this case, a cathode and an anode of the photodiode are directly connected to the input of the transimpedance amplifier. The transimpedance amplifier comprises two parallel current branches, in each of which a number of transistors are arranged for the purpose of amplification. The circuit is advantageous in that the photodiode is directly connected to the amplifier input, i.e., without coupling capacitors, since, as a result, no additional components are in the signal path, whereby the high-frequency behavior and noise are improved, and costs are reduced. The photodiode is symmetrically connected, whereby on the one hand, the differential operation of the photodiode is made possible, and thus, on the one hand, the common-mode rejection ratio is improved, and on the other hand, both the current of the anode and the current of the cathode of the diode can be used as input currents of the amplifier. The photodiode can be biased using suitable operating point voltages. One disadvantage of the known circuit of the transimpedance amplifier is that additional amplifiers (transistors and current-source transistors) are required at its input, making the circuit more complex and degrading the noise behavior. An additional disadvantage is that the additional amplifier at the input makes an increase in the supply voltage necessary by at least two collector-emitter voltages (in particular, the collector-emitter voltage of a current-source transistor and the collector-emitter voltage of a transistor in a common-base circuit), including the operating-point voltage of the diode.

The object of the present invention is to develop a circuit which comprises a transimpedance amplifier to which a photodiode without coupling capacitors is symmetrically connected on the input side, and which makes it possible to set an operating point voltage of the photodiode, in such a way that the noise, the supply voltage, and the circuit complexity are decreased.

To achieve this object, the present invention, in connection with patent claim 1, is characterized in that the first amplifier section and the second amplifier section are connected to a common supply voltage, the first amplifier section and the second amplifier section are connected to a common current source, the input of the first amplifier section and the input of the second amplifier section have a different DC voltage, and the first amplifier section and the second amplifier section are configured in such a way that an output voltage of the first amplifier section is proportional to the input current of the first amplifier section and an output voltage of the second amplifier section is proportional to an input current of the second amplifier section.

According to the present invention, a transimpedance amplifier is provided which has comparatively minor noise behavior, a low supply voltage, and lower circuit complexity. It can be used in a versatile manner, in particular for the low-noise amplification of current signals of detectors or sensors in the high-frequency range, for example, photodetectors, Hall sensors, pressure sensors, or temperature sensors.

According to a preferred embodiment of the present invention, a photodiode is symmetrically connected to a transimpedance amplifier on the input side, wherein the anode and cathode of the photodiode are directly connected to input terminals of the transimpedance amplifier. At the input of the transimpedance amplifier, no additional components, such as capacitors and resistors, are necessary, which would degrade the bandwidth and the sensitivity, or worsen the noise, of the transimpedance amplifier. The present invention enables the provision of a transimpedance amplifier in a cost-efficient manner. The transimpedance amplifier includes an operating point adjustment section, by means of which an adjustment, for example, to a blocking voltage of the photodiode, is made possible. Advantageously, as a result thereof, different photodiode types may be connected to the input of the transimpedance amplifier in a simple manner, or the operating point of the photodiode may be set in such a way that the dark current can be minimized or the bandwidth can be maximized. Since no additional components are arranged on the input side of the transimpedance amplifier, the noise of the transimpedance amplifier can be kept low and the bandwidth can be kept high.

According to one refinement of the present invention, a differential voltage comparison unit is provided on the output side of the transimpedance amplifier, by means of which a DC voltage difference between a positive output terminal and a negative output terminal of the transimpedance amplifier can be reduced to zero.

According to a preferred embodiment of the present invention, the differential voltage balancing unit is formed by a passive high-pass filter. Said high-pass filter is made up of capacitors which are connected to the output terminals. Advantageously, the voltage signal profiles at the positive output terminal and at the negative output terminal may thereby be set to a common DC-voltage level.

According to a refinement of the present invention, the differential voltage balancing unit is formed by a feedback circuit section. Said section comprises a low-pass filter, an error correction amplifier, and a transistor circuit section, so that on the input side of the transimpedance amplifier, a differential current flows which is automatically reached in such a way that the voltage signal profiles at the positive output terminal and at the negative output terminal are set to a common DC-voltage level. In comparison to the aforementioned refinement, an RSSI (received signal strength indicator), burst mode operations, and channel failure monitoring may thereby also be implemented.

The present invention enables in particular a low supply voltage reciprocal of amplification factor (high power supply rejection ratio, PSRR), a low common-mode gain with a simultaneously high differential-mode gain due to the fully differential input level and the fully differential design of the transimpedance amplifier. Additional parasitic capacitances are not present, since the photodiode is directly connected to the input terminals at the input of the transimpedance amplifier. The present invention may preferably be used in monolithic multichannel receivers, for example, based on silicon photonics technologies.

Exemplary embodiments of the present invention are described in greater detail based on the drawings.

The following are depicted:

FIG. 1: a block diagram of the present invention

Figure 2:
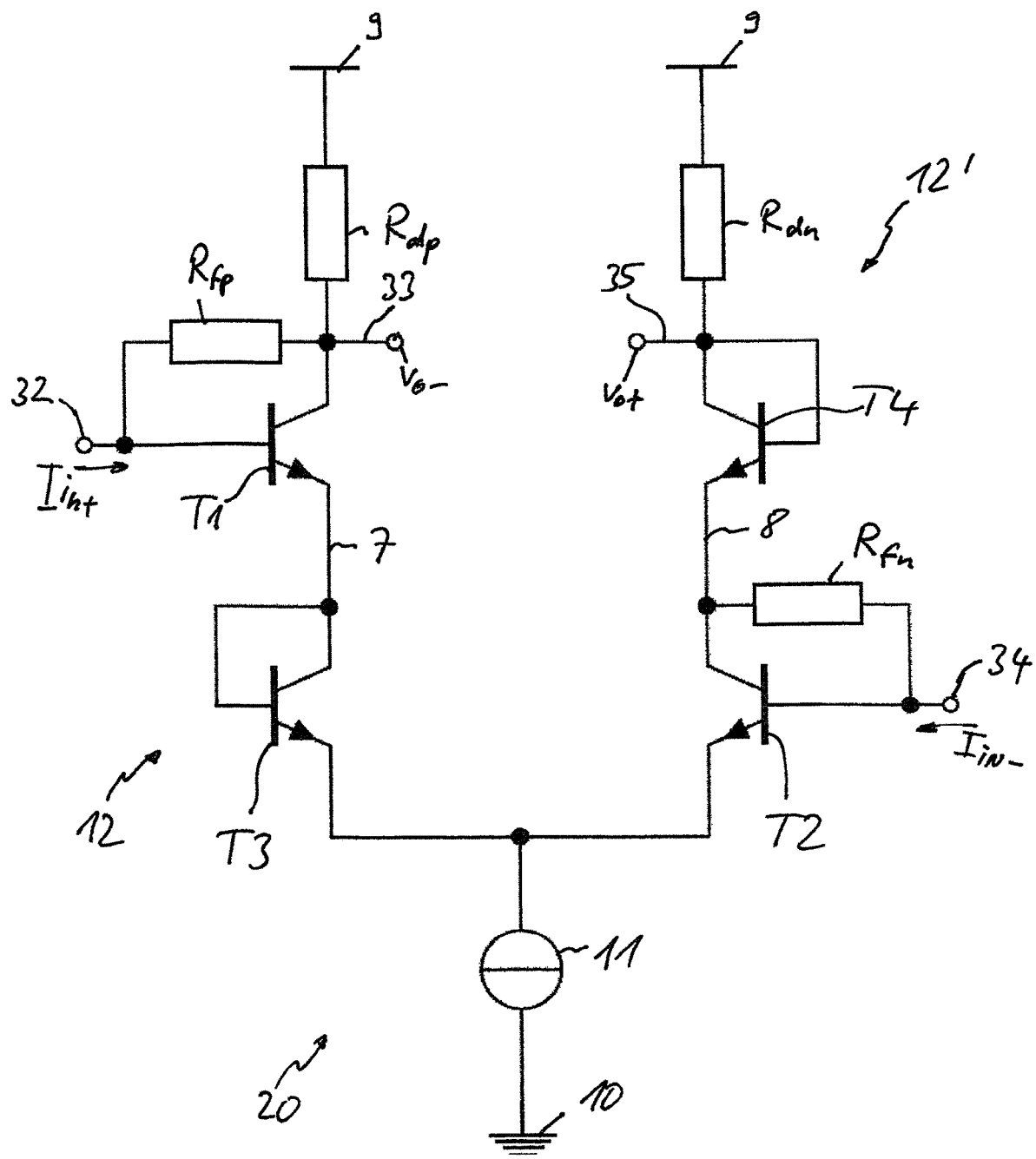

FIG. 2: an exemplary detailed embodiment of the present invention

Figure 3:
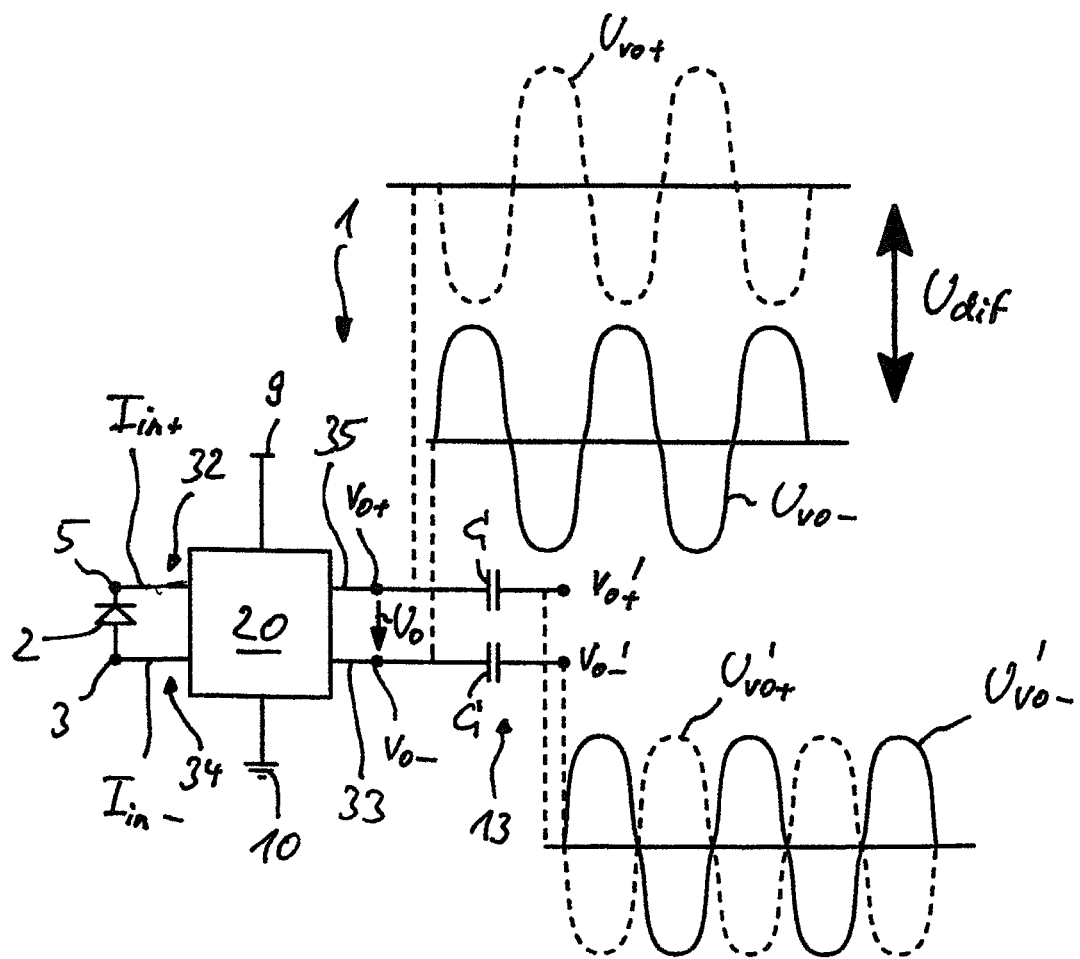

FIG. 3: an alternative embodiment of the circuit according to the present invention comprising a differential voltage balancing unit without feedback.

Figure 4:
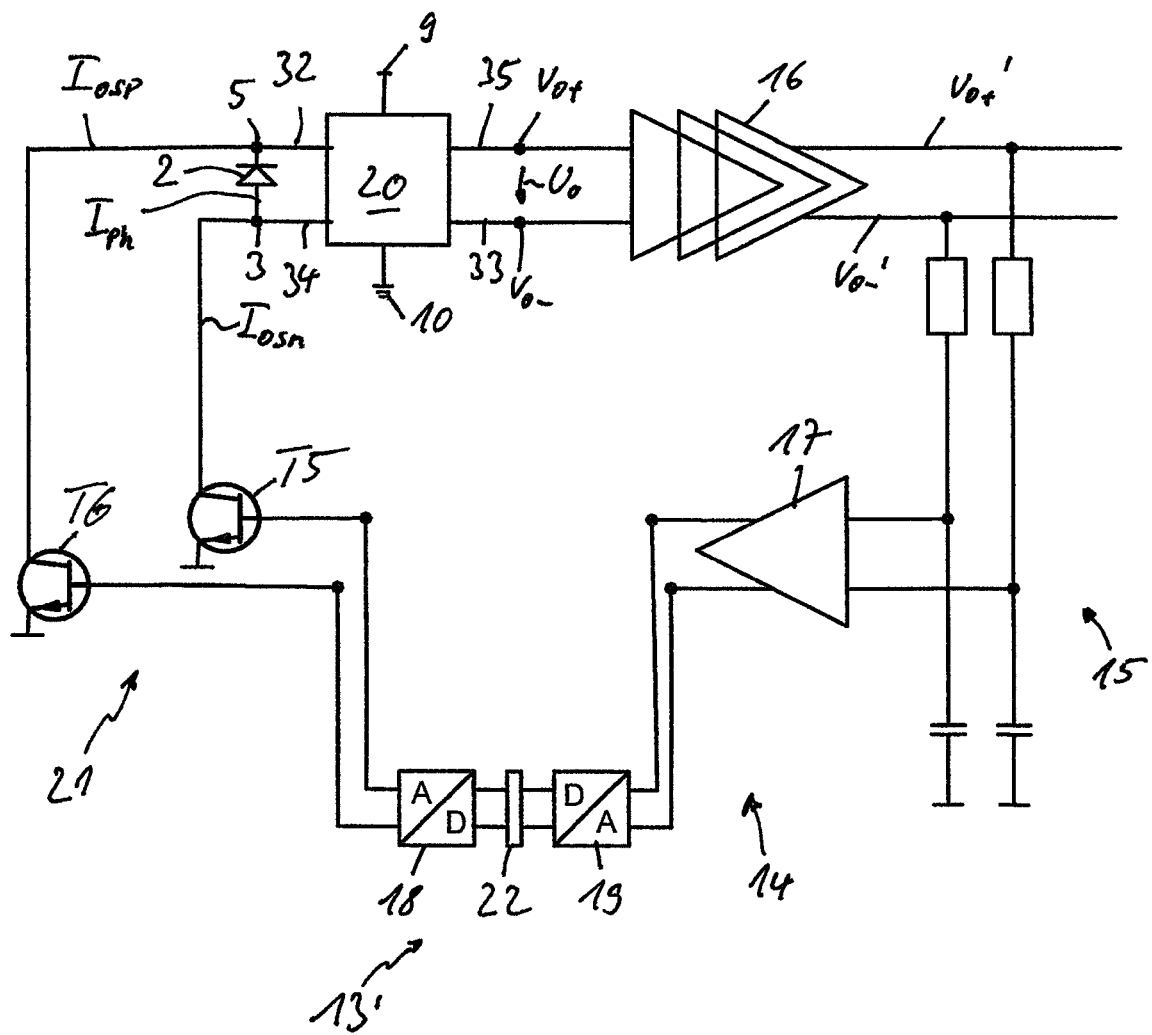

FIG. 4: an alternative embodiment of the circuit according to the present invention comprising a differential voltage balancing unit with feedback.

The circuit according to the present invention according to FIG. 1 comprises a transimpedance amplifier 20 which has a first amplifier section 30 and a second amplifier section 31. The first amplifier section 30 and the second amplifier section 31 are connected to a common supply voltage 9. In order to set an operating point, the first amplifier section 30 and the second amplifier section 31 are respectively connected to the same or a common current source 11. The circuit 20 is configured as a transimpedance amplifier.

The first amplifier section 30 has a first input terminal 32 to which a first input voltage $U_{in+}$ is applied, and into which a first input current $I_{in+}$ flows. Furthermore, the first amplifier section 30 has a first output terminal 33 at which the output voltage $U_{vo-}$ is present.

The second amplifier section 31 has a second input terminal 34 to which a second input voltage $U_{in-}$ is applied and into which a second input current $I_{in-}$ flows. Furthermore, the second amplifier section 31 has a second output terminal 35 at which the second output voltage $U_{vo+}$ is present.

According to an alternative embodiment of the circuit 20 which is not depicted, the current source 11 may be omitted, so that the first amplifier section 30 and the second amplifier section 31 are respectively connected to a ground terminal. The omission of the current source 11 is advantageous for such use cases in which the circuit is operated at a relatively low supply voltage. The higher supply voltage reciprocal of amplification factor (lower power supply rejection ratio, PSRR) is disadvantageous.

The first amplifier section 30 and the second amplifier section 31 may respectively be configured as a one-stage or multistage transistor arrangement. Advantageously, they comprise the same transistors or number of transistors.

The first amplifier section 30 and the second amplifier section 31 are respectively configured in such a way that the first output voltage $U_{vo-}$ is proportional to the first input current $I_{in+}$, and the second output voltage $U_{vo+}$ is proportional to the second input current $I_{in-}$. Advantageously, a transimpedance amplifier is thereby provided which has significantly lower noise and a lower supply voltage in comparison to the transimpedance amplifier described in U.S. Pat. No. 5,345,073 A. The circuit 20 may also be used as a pure voltage amplifier without an attached sensor. Alternatively, a sensor or a detector, for example, a Hall sensor or a photodiode, may be connected to the inputs 32, 34 of the first amplifier section 30 and the second amplifier section 31. In FIG. 1, by way of example, the photodiode 2 is connected between the first input terminal 32 of the first amplifier section 30 and the second input terminal 34 of the second amplifier section 31.

The sensor 2 is connected via a first terminal directly to the input 32 of the first amplifier section 30 and via a second terminal to the input 34 of the second amplifier section 31.

Preferably, the sensor 2 is employed having symmetrical electrical characteristics, in order to achieve optimal performance of the transimpedance amplifier. For this purpose, the input terminals 32, 34 of the amplifier sections 30, 31 have identical characteristics and charging conditions. Alternatively, the circuit 20 also functions having asymmetrical electrical characteristics.

In another embodiment of the invention, the sensor 2 may be connected only to one input, i.e., only to the input 32 of the first amplifier section 30 or the input 34 of the second amplifier section 31. The respective other input then remains, for example, unconnected. In this case, the sensor is not operated symmetrically, and the transimpedance amplifier 20 supplies a differential output signal which is proportional to the sensor current. Furthermore, two sensors 2 may also be connected to the inputs 32, 34 in such a way that the one sensor 2 is connected to the input 32 of the first amplifier section 30, and the other sensor 2 is connected to the input 34 of the second amplifier section 31. The transimpedance amplifier 20 then outputs a differential voltage which is proportional to the difference between the sensor currents.

One possible detailed embodiment of the transimpedance amplifier 20 is depicted in FIG. 2. The transimpedance amplifier 20 has two parallel current branches 7, 8 which extend between a supply voltage terminal 9 and a ground terminal 10. A current source 11 is provided on the ground terminal side.

A first current branch 7 has a first amplification transistor T1, which is configured as an NPN transistor. The first amplification transistor T1 has a collector which is connected to the positive input terminal 32 of the transimpedance amplifier 20 via the resistor $R_{fp}$ and is connected to the supply voltage via a resistor $R_{dp}$. A base of the amplification transistor T1 is directly connected to the positive input terminal 32. In a second current branch 8, a second amplification transistor T2 is arranged which is also configured as an NPN transistor. This amplification transistor T2 has a collector which is connected to the negative input terminal 34 of the transimpedance amplifier 20 via the resistor $R_{fn}$. A base of the amplification transistor T2 is also connected to the negative input terminal 34. The amplification transistors T1 and T2 form a differential amplifier. If the resistor pairs $R_{fn}$ and $R_{fp}$ and the resistor pairs $R_{dp}$ and $R_{dn}$ are identical, the value $R_{fn}=R_{fp}=R_f$ approximately represents the amplification or transimpedance Z by which an input current $I_{in}$ is amplified into an output voltage $U_o$. The input current $I_{in}$ is obtained as the difference between the input currents $I_{in+}$ and $I_{in-}$. The output voltage $U_o$ is obtained from the difference between the voltages $U_{vo+}$ and $U_{vo-}$ plus a constant offset voltage.

In addition, the transimpedance amplifier 20 comprises an operating point adjustment section 12 in the first current branch 7 for adjusting the input and output voltages of the amplification transistor T1. Simultaneously, the operating point voltage at the cathode 5 of the photodiode 2 is set by adjusting the operating point voltage at the input of the amplification transistor T1. In the present exemplary embodiment, a germanium photo diode is assumed in which the desired operating point is a blocking voltage of approximately 1 V. For this purpose, the operating point adjustment section 12 has a transistors T3 which is connected in a diode connection, i.e., a short circuit of the base and collector. In the first current branch 7, a first transistor T3 is arranged in a diode connection, wherein a collector of the transistor T3 is connected to an emitter of the amplification transistor T1. An emitter of the transistor T3 is connected to the current source 11.

In addition, the transimpedance amplifier 20 has an operating point adjustment section 12' in the second current branch 8 for adjusting the input and output voltages of the amplifier transistor T2. Simultaneously, the operating point voltage at the anode 3 of the photodiode 2 is set by adjusting the operating point voltage at the input of the amplification transistor T2. For this purpose, the operating point adjustment section 12' comprises a transistor T4 in the second current branch 8 which is connected in a diode connection, i.e., having a short circuit of the base and collector. In this case, an emitter of the transistor T4 is connected to the collector of the amplification transistor T2, and the collector and base of the transistor T4 are connected to the supply terminal 9 via a resistor $R_{dn}$.

The collector of the transistor T1 is connected to the supply terminal 9 via the resistor $R_{dp}$. The transistors T1, T2 enable the amplification of the input-side differential signal $I_{in} = I_{in+} - I_{in-}$ into an output voltage $U_o$ with the amplification $R_f$, wherein in addition, a constant offset voltage is included in $U_o$. The transistors T3, T4 effectuate an offset of the differential input and output voltage which is a function of the desired operating point voltage of the photodiode 2.

The offset of the differential output voltage is depicted in FIG. 3. The voltages $U_{vo+}$ and $U_{vo-}$ are present at the output terminals $V_{o+}$ and $V_{o-}$ 35, 33 of the circuit depicted in FIG. 3, and have a different DC component and have identical AC components in terms of magnitude, so that the differential output voltage $U_o = U_{vo+} - U_{vo-}$ has a constant offset voltage.

An additional embodiment of the present invention for eliminating the offset of the differential output voltage $U_o$ is depicted in FIG. 3. It comprises a transimpedance amplifier 20 which is symmetrically connected to a photodiode 2 on the input side. An anode 3 of the photodiode 2 is connected to a negative input terminal 34 of the transimpedance amplifier 20, and a cathode 5 of the photodiode 2 is connected to a positive input terminal 32 of the transimpedance amplifier 20. The transimpedance amplifier 20 has a positive output terminal 35 or $V_{o+}$, and a negative output terminal 33 or $V_{o-}$, as is apparent from FIG. 3. These two voltages are phase-shifted by 180° and have a different DC-voltage component, so that an offset voltage $U_{dif}$ is obtained. Typically, $U_{dif}$ is constant or changes slowly. In order to reduce the offset voltage $U_{dif}$ to zero, a differential voltage balancing unit 13 according to FIG. 3 is provided, by means of which the offset voltage, or the DC-voltage difference $U_{dif}$ between the positive output terminal $V_{o+}$ and the negative output terminal $V_{o-}$ of the transimpedance amplifier 20, is reduced to zero. This differential voltage balancing unit 13 is configured as a passive high-pass filter which comprises capacitors C which are respectively connected to the output terminals $V_{o+}$, $V_{o-}$, so that output signals $U_{vo+}'$ and $U_{vo-}'$ are obtained at the modified output terminals $V_{o+}'$ and $V_{o-}'$ which have the same DC-voltage component, unlike the voltages $U_{vo+}$, $U_{vo-}$ which are present at the output terminals $V_{o+}$, $V_{o-}$.

According to an alternative embodiment according to FIG. 4, a differential voltage balancing unit 13' may be provided which is formed by a feedback circuit section 14. This feedback circuit section 14 has a differential low-pass filter 15 which is directly connected to the transimpedance amplifier 20 or to additional amplifier stages 16 arranged on the output side of the transimpedance amplifier 20. In the feedback branch, an error correction amplifier 17 is connected to the low-pass filter 15. An A/D converter 19, a register 22, and a D/A converter 18 are connected to the error correction amplifier 17. On the output side of the D/A converter 19, a transistor circuit section 21 is provided which is made up of two transistors T5, T6.

Collector terminals of the transistors T5, T6 are respectively connected to the negative input terminal 34 and positive input terminal 32 of the transimpedance amplifier 20. In the operating state, collector currents $I_{osp}$, $I_{osn}$ of the transistors T5, T6 flow to the input terminals 34 and 32, and a current $I_{ph}$ flows through the photodiode 2. Via the feedback circuit section 14, a change in the DC component of the input current $I_{in}$ results at the transimpedance amplifier 20 by means of an offset current which arises, causing the output voltage signals $U_{vo+}'$ and $U_{vo-}'$ to have the same DC-voltage components. One advantage of the use of the A/D converter 19, register 22, and D/A converter 18 is that the clock of the register 22 can be activated or deactivated as needed. If the clock is activated, the currents $I_{osp}$ and $I_{osn}$ are precisely and continuously readjusted. On the other hand, if the clock is deactivated, the most recently detected settings for the currents $I_{osp}$ and $I_{osn}$ are retained and no longer change. This may be advantageous if, for example, the dynamic control behavior of the feedback circuit section 14 unfavorably influences the output signal of the transimpedance amplifier 20. In this case, a fixed setting of $I_{osp}$ and $I_{osn}$ may be necessary.

According to an alternative embodiment of the present invention which is not depicted, the A/D converter 19, the register 22, and the D/A converter 18 may be omitted, and the outputs of the error correction amplifier 17 may be directly connected to the inputs of the transistors T5 and T6.

It goes without saying that that the aforementioned transistors T1, T2, T3, T4, T5, T6 may be configured other types than bipolar transistors, for example, field-effect transistors. Although the bipolar transistors are provided in the embodiments described herein, it is clear to those skilled in the art that any of the bipolar transistors may be replaced in alternative embodiments by a variety of other types of transistors, for example, field-effect transistors. In this respect, emitter, collector, and base terminals of the bipolar transistors described here correspond to source, drain, and gate terminals in embodiments which comprise field-effect transistors, and may be used interchangeably when describing the embodiment. The use of the terms emitter, collector, and base terminals accordingly does not act in a limiting manner on embodiments or the present invention. Likewise, it is clear to those skilled in the art that, in the case of suitable setting of the operating point voltages and currents of the transistors, PNP transistors may be used instead of NPN transistors, or P-field-effect transistors may be used instead of N-field effect transistors.

The block diagram images depicted herein are merely an example. Many modifications of these block diagram images or of the operations described herein are possible without deviating from the spirit of the present invention. For example, the circuits may be arranged in a different sequence, or circuits may be added, deleted, or modified. All of these modifications are considered to be an integral part of the claimed invention.

In an additional embodiment, the amplifiers formed by the amplification transistors T1 and T2 may also be replaced by multistage amplifier circuits. This may, for example, enable a higher bandwidth.

In an additional embodiment, the operating point adjustment sections 12 and 12' may also be formed by $V_{BE}$ multipliers (see, for example, "$V_{BE}$-Multiplier", in Crecraft, David; Gergely, Stephen (May 21, 2002). Analog Electronics. Butterworth-Heinemann. p. 188. ISBN 0080475833). In the case of $V_{BE}$ multipliers, it is advantageous, in comparison to diodes, that voltages may be generated therewith which have the magnitude $k*V_{BE}$, wherein k does not have to be an integer.

The invention claimed is:

1. A circuit including a transimpedance amplifier (20) for converting two input currents (Iin+, Iin−) into two output voltages (Uvo−, Uvo+), comprising a first amplifier section (30) including a first input (32) to which a first input voltage (Uin+) is applied and into which a first input current (Iin+) flows, and comprising a second amplifier section (31) including a second input (34) to which a second input voltage (Uin−) is applied and into which a second input current (Iin−) flows, characterized in that the first amplifier section (30) and the second amplifier section (31) are connected to a common supply voltage (9), the first amplifier section (30) and the second amplifier section (31) are connected to a common current source (11), the input (32) of the first amplifier section (30) and the input (34) of the second amplifier section (31) have a different DC voltage, and the first amplifier section (30) and the second amplifier section (31) are configured in such a way that an output voltage (Uvo−) of the first amplifier section (30) is proportional to the input current (Iin+) of the first amplifier section (30) and an output voltage (Uvo+) of the second amplifier section (31) is proportional to an input current (Iin−) of the second amplifier section (31), the circuit further characterized in that the transimpedance amplifier (20) is used for converting an input current (Iin) supplied by a sensor (2) into an output voltage (Uo), wherein the sensor (2) is directly connected to two input terminals (32, 34) of the transimpedance amplifier (20); the transimpedance amplifier (20) comprises two parallel current branches (7, 8) having a number of transistors (T1, T2, T3, T4) in each case, wherein the current branches (7, 8) extend between a supply terminal (9) and a first terminal of a current source (11), wherein the second terminal of the current source is connected to ground, a first terminal (3) of the sensor (2) is connected to a base terminal of a first amplification transistor (T1) arranged in a first current branch (7), and via a first resistor (Rfp) to a collector terminal of the first amplification transistor (T1); the collector of the first amplification transistor T1)is connected via a third resistor (Rdp) to the supply voltage, a second terminal (5) of the sensor (2) is connected to a base terminal of a second amplification transistor (T2) arranged in a second current branch (8), and via a second resistor (Rfn) to a collector terminal of the second amplifier transistor (T2), in the first current branch (7), a first operating point adjustment section (12) is provided for adjusting the input and output voltages of the first amplification transistor (T1), said section being arranged between the emitter of the first amplification transistor (T1) and the first terminal of the current source (11), in the second current branch (8), a second operating point adjustment section (12′) is provided for adjusting the input and output voltages of the second amplifier transistor (T2), said section being connected between the collector of the second amplification transistor (T2) and a first terminal of a fourth resistor (Rdn) which is connected at its second terminal to the supply voltage (9).

2. The circuit as claimed in claim 1, characterized in that the current source (11) is replaced by a short circuit.

3. The circuit as claimed in claim 1, characterized in that the first amplifier section (30) and the second amplifier section (31) are configured as a one-stage or multistage transistor arrangement.

4. The circuit as claimed in claim 1, characterized in that a sensor (2), in particular a photodiode, is connected via a first terminal directly to the first input terminal (32) of the first amplifier section (30), and via a second terminal directly to the second input terminal (34) of the second amplifier section (31).

5. The circuit as claimed in claim 1, characterized in that the first amplifier section (30) and the second amplifier section (31) comprise the same transistors and/or the same number of transistors.

6. The circuit as claimed in claim 1, characterized in that the first operating point adjustment section (12) comprises a transistor (T3) having a short circuit between the base and the collector of the same, and the second operating point adjustment section (12′) also comprises a transistor (T4) having a short circuit between the base and the collector of the same.

7. The circuit as claimed in claim 1, characterized in that the first resistor (Rfp) and the second resistor (Rfn) are identical on the one hand, and the third resistor (Rdp) and the fourth resistor (Rdn) are identical on the other hand.

8. The circuit as claimed in claim 1, characterized in that a number of transistors (T5) of the first operating point adjustment section (12) are provided as a function of an operating point voltage of the sensor (2).

9. The circuit as claimed in claim 1, characterized in that a number of transistors (T6) of the second operating point adjustment section (12′) are provided for the symmetrical operation of the overall circuit.

10. The circuit as claimed in claim 1, characterized in that a positive output terminal (35, Vo+) of the transimpedance amplifier (20) is connected to a collector terminal of the second operating point adjustment section (12′, T4), and a negative output terminal (33, Vo−) of the transimpedance amplifier (20) is connected to a collector terminal of the first amplification transistor (T1).

11. The circuit as claimed in claim 1, characterized in that at output terminals (35, 33; Vo+, Vo−) of the transimpedance amplifier (20), a number of amplifier stages (16) are connected to a positive output terminal (Vo+') and to a negative output terminal (Vo−').

12. A circuit including a transimpedance amplifier (20) for converting two input currents (Iin+, Iin−) into two output voltages (Uvo−, Uvo+), comprising a first amplifier section (30) including a first input (32) to which a first input voltage (Uin+) is applied and into which a first input current (Iin+) flows, and comprising a second amplifier section (31) including a second input (34) to which a second input voltage (Uin−) is applied and into which a second input current (Iin−) flows, characterized in that the first amplifier section (30) and the second amplifier section (31) are connected to a common supply voltage (9), the first amplifier section (30) and the second amplifier section (31) are connected to a common current source (11), the input (32) of the first amplifier section (30) and the input (34) of the second amplifier section (31) have a different DC voltage, and the first amplifier section (30) and the second amplifier section (31) are configured in such a way that an output voltage (Uvo−) of the first amplifier section (30) is proportional to the input current (Iin+) of the first amplifier section (30) and an output voltage (Uvo+) of the second amplifier section (31) is proportional to an input current (Iin−) of the second amplifier section (31), characterized in that at the output terminals (35, 33; Vo+, Vo−) of the transimpedance amplifier (20) or the amplifier stages (16), a differential voltage balancing unit (13, 13') is provided, by means of which a DC-voltage difference (Udif) between the voltage (Uvo+) at the positive output terminal (35, Vo+) and a voltage (Uvo−) at the negative output terminal (Vo−, 33) of the transimpedance amplifier (20) is reduced to zero.

13. The circuit as claimed in claim 12, characterized in that the differential voltage balancing unit (13) is formed by a differential, passive high-pass filter which is formed by capacitors (C) connected to the respective output terminals (33, 35; Vo+, Vo−) of the transimpedance amplifier (20).

14. The circuit as claimed in claim 12, characterized in that the differential voltage balancing unit (13') is formed by a feedback circuit section (14) which comprises several components connected in series:

a differential low-pass filter (15) which is connected to the output terminals (33, 35; Vo+, Vo−) of the transimpedance amplifier (20) or the amplifier stages (16, Vo+', Vo−'), an error correction amplifier (17), a transistor circuit section (21) which is connected to a first terminal (3) and a second terminal (5) of a sensor (2) in such a way that a differential DC voltage which is present at the output (33, 35) of the transimpedance amplifier (20) goes to zero.

15. The circuit as claimed in claim 14, characterized in that the feedback circuit section (14) between the error correction amplifier (17) and the transistor circuit section (21) comprises a series circuit made up of an A/D converter (19), a register (22), and a D/A converter (18).

16. The circuit as claimed in claim 14, characterized in that the DC voltage difference between (20,32,34) at the transimpedance stage for the sensor (2) is determined by the transistors (T3,T4) when the transimpedance amplifier (20) has zero differential DC voltage at the output (33,35) or at the amplifier stages (16, Vo+', Vo−').

\* \* \* \* \*